United States Patent [19]

Caviglia

[11] Patent Number: 5,334,545
[45] Date of Patent: Aug. 2, 1994

[54] PROCESS FOR FORMING SELF-ALIGNING COBALT SILICIDE T-GATES OF SILICON MOS DEVICES

[75] Inventor: Anthony L. Caviglia, Laurel, Md.

[73] Assignee: Allied Signal Inc., Morris Township, Morris County, N.J.

[21] Appl. No.: 11,632

[22] Filed: Feb. 1, 1993

[51] Int. Cl.$^5$ .................. H01L 21/283; H01L 21/336
[52] U.S. Cl. .............................. 437/41; 437/193; 437/200; 156/657
[58] Field of Search .............. 437/41, 44, 200, 193, 437/912, 228; 156/657; 257/388, 413

[56] References Cited

U.S. PATENT DOCUMENTS

| | | |
|---|---|---|
| 4,285,761 | 8/1981 | Fatula, Jr. et al. . |
| 4,362,597 | 12/1982 | Fraser et al. .......... 156/643 |
| 4,378,628 | 4/1983 | Levinstein et al. . |
| 4,470,189 | 9/1984 | Roberts et al. . |
| 4,528,066 | 7/1985 | Merkling, Jr. et al. ........ 156/643 |
| 4,901,121 | 2/1990 | Gibson et al. . |
| 4,912,061 | 3/1990 | Nasr . |
| 5,034,791 | 7/1991 | Kameyama et al. ........ 357/23.9 |
| 5,064,773 | 11/1991 | Feist . |
| 5,086,017 | 2/1992 | Lu ........................ 437/200 |
| 5,089,863 | 2/1992 | Satoh et al. ............. 357/23.3 |
| 5,115,290 | 5/1992 | Murakami et al. ........ 357/23.9 |
| 5,120,668 | 6/1992 | Hsu et al. . |

OTHER PUBLICATIONS

Ma, E., et al., "Comparisons of Silicide Formation . . . ", Mat. Res. Soc. Symp. Proc., vol. 92, 1987, pp. 205-211.
Sze, S. M., VLSI Technology, McGraw-Hill, 1983, pp. 319-326.
A. K. Agawal, et al., "Microx-An Advanced Silicon Technology for Microwave Circuits Up to X-Band", 1991 IEDM Tech. Digest, pp. 687-690.

*Primary Examiner*—T. N. Quach
*Attorney, Agent, or Firm*—Howard G. Massung

[57] ABSTRACT

A process for producing a cobalt silicide T-gate on a silicon substrate (10) in which a silicon oxide gate layer (12) is formed in the silicon substrate (10). The silicon oxide gate layer (12) is covered with a polysilicon layer (14) and a masking oxide layer (16). An opening (18) is formed in the masking oxide layer (16) through to the polysilicon layer (14) which defines a gate region (22) for the device being fabricated (16). A cobalt layer (20) is deposited on the masking oxide layer (16) and the surface of the polysilicon layer (14) in the gate region (22). The substrate (10) is then heated to react the cobalt layer (20) with the polysilicon layer (14) to form a cobalt silicide layer (24) in the gate region (22). The unreacted portion of the cobalt layer (20) and masking oxide layer (16) are removed and the polysilicon layer (14) etched using the cobalt silicide layer (24) as a mask. The etching undercuts a portion of the polysilicon layer (14) under the cobalt silicide layer (24) forming a self-aligned cobalt silicide T-gate structure.

7 Claims, 1 Drawing Sheet

PROCESS FOR FORMING SELF-ALIGNING COBALT SILICIDE T-GATES OF SILICON MOS DEVICES

TECHNICAL FIELD

The invention is related to the field of silicon MOS devices and, in particular, to a process for forming self-aligning cobalt silicide T-gate structures on a silicon substrate.

BACKGROUND ART

Metal T-gates have been used for some time to improve the microwave performance of III–IV FET's by simultaneously providing low gate resistance and low parasitic capacitance. T-gates are not common in silicon MOS devices since gate resistance does not usually limit performance in digital circuits. Although MOS devices are rarely used in microwave applications, recent advances have created interest in MOS technology as a low cost alternative in the current gallium arsenide and silicon bipolar technologies. In conventional MOS devices, gate resistance is the dominant factor limiting the microwave performance of the device, thus a T-gate providing a low gate resistance and low parasitic capacitance is ideally suited for these applications.

A. K. Agarwal et al, in their article "MICROX—An Advanced Silicon Technology For Microwave Circuits Up To X-Band," published in the 1991 *IEDM TECH DIGEST*, pp. 687–690, discloses a microwave SOI process with T-gates. The T-gates are fabricated by first forming a conventional gate then using e-beam lithography to align and pattern a gold cap on the gate. However, both the use of e-beam lithography and gold are inconsistent with the goals of low cost technology.

Nasr, in U.S. Pat. No. 4,912,061, discloses an alternative for forming a cobalt silicide self-aligned metal oxide semiconductor device using disposable silicon nitride spacers.

SUMMARY OF THE INVENTION

The invention is a process for making a self-aligned cobalt silicide T-gate for silicon MOS devices. The process comprises the steps of forming a gate oxide layer on a top surface of a silicon substrate then forming a polysilicon layer on the gate oxide layer. A masking oxide layer is then formed on the polysilicon layer. An opening is formed in the masking oxide layer, exposing a gate region on the polysilicon layer. A layer of cobalt is then deposited over the masking oxide layer and the surface of the polysilicon layer exposed by the opening in the masking oxide layer and heated to a temperature in the range from 600° C. to 700° C. for a time sufficient for the layer of cobalt to react with the polysilicon in the gate region to form a cobalt silicide layer. The unreacted portion of the cobalt layer and the underlying masking oxide layer are removed by a selective etch as in a conventional self-aligned silicide process. The polysilicon is then reactive ion etched or etched using the cobalt silicide layer as a mask. The polysilicon underlying the cobalt silicide layer is only partially etched away leaving a self-aligned T-gate structure in the gate region of the MOS device.

One advantage of the cobalt silicide T-gate structure is that it automatically aligns the gate with subsequently formed source and drain regions.

Another advantage of the cobalt silicide T-gate structure is that it provides low gate resistance and low parasitic capacitance.

Another advantage is that the process allows a significant reduction in the thickness of the polysilicon layer without increasing gate resistivity.

Still another advantage is that the thinner polysilicon layer results in easier planarization of subsequent layers and easier etching of sub-micron gates.

These and other advantages of the process for forming self-aligned cobalt silicide T-gates will become more apparent from a reading of the specification in conjunction with the attached drawings.

DETAILED DESCRIPTION OF THE INVENTION

Figure 1:
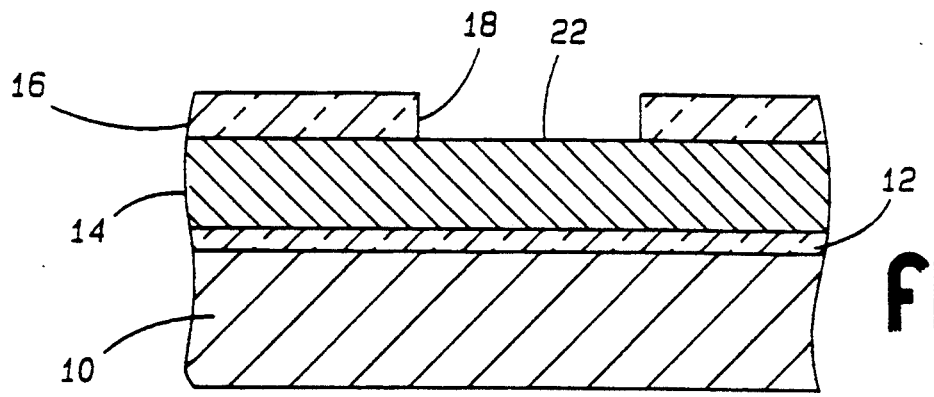
FIG. 1 is a cross-sectional view of the MOS device showing the substrate, the added layers and the oxide mask.

The process for producing a self-aligned cobalt silicide T-gate for silicon MOS devices is illustrated in FIGS. 1 through 4. FIG. 1 shows a silicon substrate 10 on which is formed a silicon oxide gate layer 12. The substrate may be processed using any of the methods known in the art to form the silicon oxide gate layer 12. A polysilicon layer 14 about 4,000 Å thick is deposited on the gate oxide layer 12. A silicon dioxide masking layer 16 is grown or deposited on the polysilicon layer 14 and is patterned to provide an opening 18 defining a gate region where a gate is to be formed.

Figure 2:
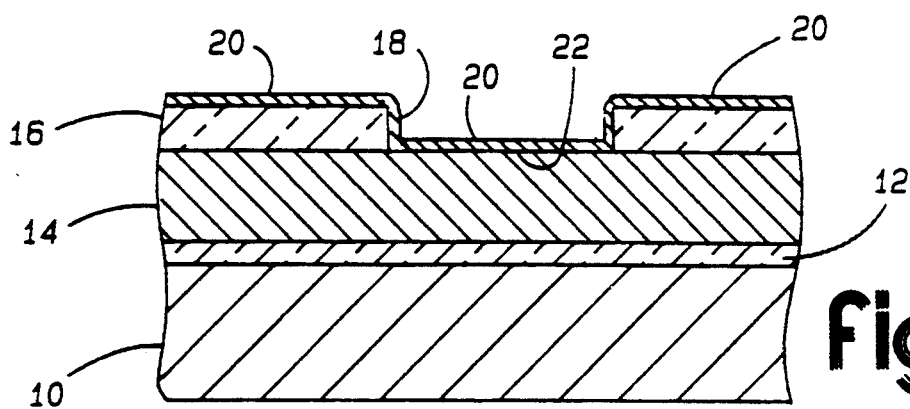
FIG. 2 is a cross-sectional view showing the deposited cobalt layer.
Figure 3:
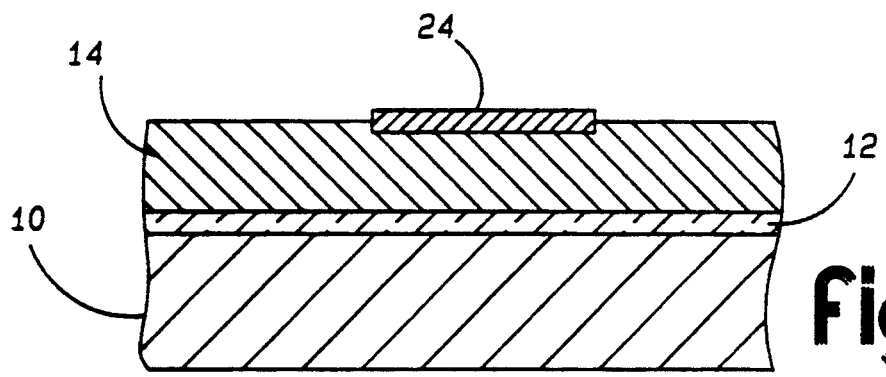
FIG. 3 is a cross-sectional view showing the resultant cobalt silicide layer after heating and removal of the unreacted cobalt layer and the masking oxide layer.

A layer of cobalt 20 is then deposited on the masking layer 16 and on the top surface 22 of the polysilicon layer 14 within the opening 18 as shown in FIG. 2. This structure is then heated to a temperature in the range from 600° C. to 700° C. for a time sufficient for the cobalt layer 20 deposited on the polysilicon layer 14 within the opening 18 to react with the polysilicon to form a cobalt silicide layer 24 as shown in FIG. 3. The cobalt layer 20 deposited on the surface of the oxide masking layer 16 does not react with the masking oxide layer 16. This unreacted cobalt of the cobalt layer 20 remaining on the surface of the masking oxide layer 16 is removed by a selective wet etch leaving only the oxide masking layer 16 and the cobalt silicide layer 24.

Figure 4:
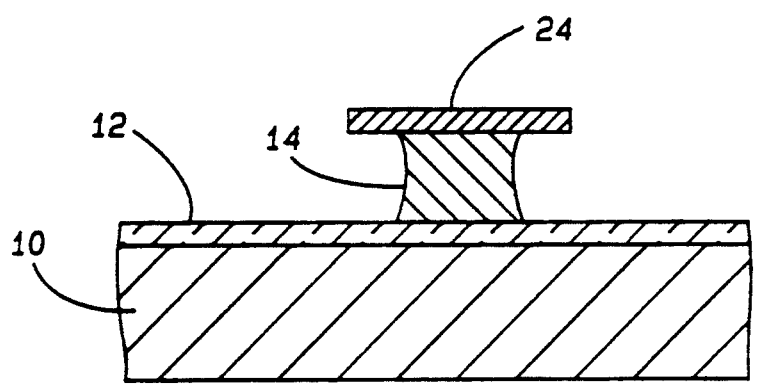
FIG. 4 is a cross-sectional view showing the resultant cobalt silicide T-gate structure after etching of the polysilicon layer.

Since the cobalt silicide layer 24 is largely impervious to reactive ion etching, the remainder of the masking oxide layer is removed using reactive ion etching. Subsequently, the remainder of the polysilicon layer 14 is removed using a conventional wet or reactive ion etching process. During this etching process, the cobalt silicide layer 24 becomes an etch mask, which prevents the etching of the polysilicon thereunder. During the etching process, a portion of the polysilicon under the cobalt silicide layer 24 will be etched from the sides forming a self-aligned T-gate structure standing upright on the substrate 10 and the gate oxide layer 12 as shown in FIG. 4.

This process provides the usual advantages of the T-gate structure in which the cobalt silicide layer acts as a self-aligned mask for the subsequent formation of source and drain regions on opposite sides of the gate. The process further provides a lower gate resistance and allows significant reduction in the thickness of the polysilicon layer 14 without increasing gate resistivity. The thinner polysilicon layer further results in easier planarization layers and easier etching of sub-micron gates.

Having disclosed the process for making cobalt silicide T-gates for silicon MOSFET's, is it recognized that others skilled in the art may make certain changes or improvements to the process within the scope of the invention as set forth in the appended claims.

What is claimed is:

1. A process for making a self-aligned cobalt silicide T-gate for silicon MOS devices comprising the steps of:
    forming a gate oxide layer on a top surface of a silicon substrate;
    forming a polysilicon layer on said gate oxide layer;
    forming a masking oxide layer on said polysilicon layer, said masking oxide layer having an opening exposing a gate region on said polysilicon layer;
    depositing a layer of cobalt on said masking oxide layer and said gate region of the polysilicon layer;
    heating said substrate to react said cobalt layer with said polysilicon layer in said opening to form a cobalt silicide layer in said gate region, said cobalt layer deposited on said masking oxide layer remaining unreacted;
    removing said unreacted portion of said cobalt layer and said masking oxide layer to expose said polysilicon layer in the region not covered by said cobalt silicide layer; and
    etching said exposed polysilicon layer using said cobalt silicide as a mask to form said self-aligned cobalt silicide T-gate.

2. The process of claim 1 wherein said step of forming said polysilicon layer comprises the step of depositing a layer of polysilicon approximately 4,000 Å thick.

3. The process of claim 1 wherein said step of heating comprises the step of heating said substrate to a temperature in the range from 600° C. to 700° C. for a time sufficient for said cobalt layer to react with said polysilicon layer to form said cobalt silicide layer.

4. The process of claim 1 wherein said step of removing said masking oxide layer and said unreacted cobalt layer comprises the steps of:
    wet etching to remove said unreacted cobalt layer from said masking oxide layer; and
    reactive ion etching to remove said masking oxide layer from said polysilicon layer.

5. A process for forming a cobalt silicide T-gate on a silicon substrate comprising the steps of:
    forming a gate silicon oxide layer on a surface of said silicon substrate;
    depositing a polysilicon layer on said gate silicon oxide layer;
    forming a masking layer on said polysilicon layer, said masking layer having an opening exposing a gate region on said polysilicon layer;
    forming a cobalt silicide layer in said gate region;
    etching to remove said masking layer; and
    selective etching said polysilicon layer using said cobalt silicide layer as a mask to form said cobalt silicide T-gate.

6. The process of claim 5 wherein said step of forming a silicide layer comprises the steps of:
    depositing a layer of cobalt on said masking layer and on said polysilicon layer within said gate; and
    heating said silicon substrate to react said layer of cobalt with said polysilicon layer in said gate region to form said cobalt silicide layer.

7. The process of claim 6 wherein said step of heating comprises the step of heating said silicon substrate to a temperature between 600° C. to 700° C. for a time sufficient for said cobalt layer to react with said polysilicon layer to form said cobalt silicide layer.

* * * * *